United States Patent [19]
Melton et al.

[11] Patent Number: 5,269,453
[45] Date of Patent: Dec. 14, 1993

[54] LOW TEMPERATURE METHOD FOR FORMING SOLDER BUMP INTERCONNECTIONS TO A PLATED CIRCUIT TRACE

[75] Inventors: Cynthia M. Melton, Bolingbrook; Kenneth Cholewczynski, Streamwood; Kevin D. Moore, Schaumburg; Carl Raleigh, Cary, all of Ill.

[73] Assignee: Motorola, Inc., Schaumburg, Ill.

[21] Appl. No.: 958,398

[22] Filed: Oct. 8, 1992

Related U.S. Application Data

[63] Continuation-in-part of Ser. No. 862,028, Apr. 2, 1992, abandoned.

[51] Int. Cl.⁵ .............................................. H05K 3/34
[52] U.S. Cl. ............................. 228/180.22; 228/195; 228/254
[58] Field of Search ............... 228/122, 180.2, 188, 228/189, 195, 254

[56] References Cited

U.S. PATENT DOCUMENTS

| | | |
|---|---|---|
| 3,488,840 | 1/1970 | Hymes . |
| 3,702,500 | 11/1972 | Gorings . |
| 3,871,014 | 3/1975 | King et al. . |
| 3,871,015 | 3/1975 | Lin et al. . |
| 4,545,610 | 10/1985 | Lakritz . |
| 4,673,772 | 6/1987 | Satoh . |
| 4,727,633 | 1/1988 | Herrick . |
| 4,848,643 | 7/1989 | Frische . |
| 4,878,611 | 11/1989 | LoVasco . |
| 4,914,814 | 4/1990 | Behun . |
| 5,008,997 | 4/1991 | Phy .................................. 228/180.2 |
| 5,038,996 | 8/1991 | Wilcox et al. .................... 228/195 |
| 5,186,379 | 2/1993 | Helber, Jr. ....................... 228/180.2 |
| 5,186,383 | 2/1993 | Melton et al. ................... 228/180.2 |

Primary Examiner—Samuel M. Heinrich
Attorney, Agent, or Firm—Douglas D. Fekete

[57] ABSTRACT

An integrated circuit component is attached to a printed circuit board by solder bump interconnections that are formed between metal bumps on the component and a metal-plated terminal on the board. The metal plate overlies both a bond pad and an adjacent runner of each terminal and is formed of a first metal, which is preferably a tin-base alloy. The metal bumps on the component are formed of a second metal, which is preferably an indium-base alloy. The component and board are assembled and heated to a temperature less than the melting temperatures of the first and second metals. At the interface between the bumps and the plate, the first and second metals cooperate to form a liquid phase which, upon cooling and solidifying, completes the interconnection.

14 Claims, 1 Drawing Sheet

LOW TEMPERATURE METHOD FOR FORMING SOLDER BUMP INTERCONNECTIONS TO A PLATED CIRCUIT TRACE

BACKGROUND OF THE INVENTION

This is a continuation-in-part of U.S. patent application Ser. No. 862,028, filed Apr. 2, 1992 now abandoned.

This invention relates to a method for attaching an integrated circuit component to a printed circuit board by a solder bump interconnection. More particularly, this invention relates to a method for forming such interconnection between a circuit trace on the board that is coated with a metal plate and a metal bump fixed to the component, which interconnection is formed without exceeding the melting temperatures of either the plate or the bump.

In the manufacture of a microelectronic package, it is known to mount an integrated circuit component to a printed circuit board by a plurality of solder bump interconnections that not only physically attach the component, but also electrically connect an electrical circuit of the component to an electrical circuit on the board for conducting electrical signals to and from the component for processing. For this purpose, the board comprises a circuit trace, typically formed of copper, which trace is disposed on a dielectric substrate. The trace includes terminals, each having a bond pad connected to a runner. The component, which may be, for example, an integrated circuit die, has a plurality of solderable pads. To form the interconnection, a solder bump is affixed to each bond pad of the component. The component is then assembled with the board such that each bump rests upon a corresponding bond pad on the board. The assembly is then briefly heated to reflow the solder alloy and thereby bond the bump to the bond pad on the board to complete the interconnection. In common practice, a solder stop is applied to the runner to confine the solder to the terminal pad during reflow. In the absence of the solder stop, the solder tends to wick along the runner, leading to catastrophic collapse of the component against the board.

U.S. Pat. No. 5,186,383 issued to Melton et al. on Feb. 16, 1993, describes a method for forming solder bump interconnections to a circuit board that includes a solder plate on the trace that extends over both the pad and the runner, without a solder stop. To form the interconnections, the assembly is heated to a temperature sufficient to melt the solder plate, but not the solder bump. The solder liquid derived from the plate wets the bump and, upon cooling, produces the desired interconnection. Although this method successfully forms interconnections to a solder-plated trace, there is a tendency for the solder from the bump to dissolve into the liquid and spread along the runner. It is desired to eliminate this non-productive loss and retain a greater mass of solder at the interconnection for increased strength and conductivity.

SUMMARY OF THE INVENTION

This invention contemplates a method for attaching an integrated circuit component to a metal-plated circuit trace of a printed circuit board by solder bump interconnections, which method is carried out without exceeding the melting temperatures of the metals applied to the component and the trace. In accordance with a preferred embodiment, the printed circuit board comprises a circuit trace including at least one terminal having a bond pad and a runner section extending from the pad. A metal plate is deposited on the trace to continuously coat the pad and the runner section, and is formed of a first metal. At least one metal bump is attached to the component and is composed of a second metal compositionally distinct from the first metal. The first metal and the second metal are selected such that the metals or their constituents are fusable to produce a solder composition having a melting temperature less than the melting temperatures of the first and second metals individually. Thereafter, the component is superposed onto the board such that the bump rests against the plate at the bond pad. The assembly is heated to a temperature greater than melting temperature of the solder composition. At the interface between the bump and the plate, the metals cooperate to form a liquid phase that wets the bump and the plate. Upon cooling, the liquid phase solidifies to bond the bump to the terminal to form the desired interconnection.

Therefore, this invention produces a solder bump interconnection without reflowing the initial metals that form the bump and the plate, but rather by forming a liquid phase that is limited to the interface between the bond pad and the bump. By avoiding reflow of the metal plate, the integrity of the plate is maintained on regions of the trace remote from the bond pad. Also, the volume of liquid is minimized to reduce dissolution of the bump and flow of solder along the runners. Nevertheless, sufficient liquid is formed at the bond pad to, upon cooling, complete a strong solder bond to join the bump to the circuit trace. Thus, this invention provides a method that allows solder bump interconnections to be formed to a plated circuit trace without the unproductive loss of solder alloy from the bond pads that would otherwise reduce the size and strength of the interconnection.

DESCRIPTION OF THE DRAWINGS

The present invention will be further illustrated with reference to the accompanying drawings wherein.

DETAILED DESCRIPTION OF THE INVENTION

Figure 1:
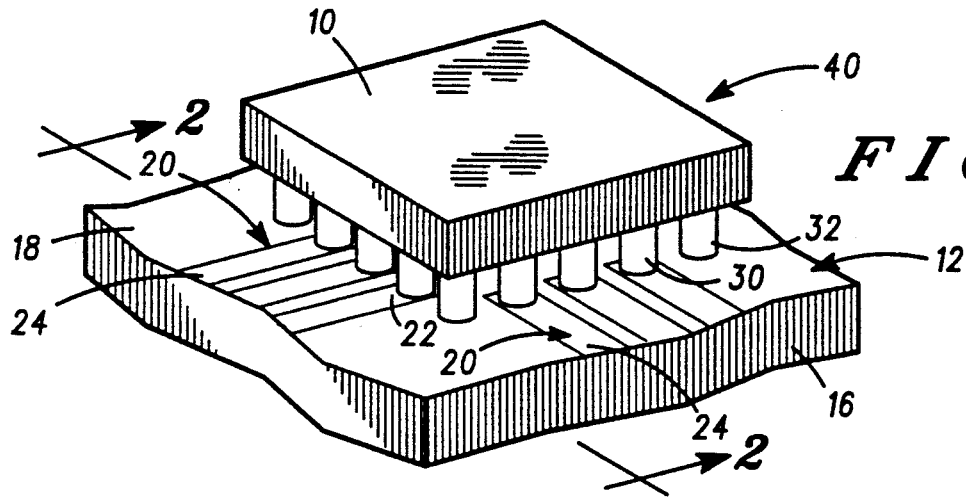
FIG. 1 is a perspective view of a component assembled with a solder-plated printed circuit board in preparation for forming solder bump interconnections in accordance with this invention.
Figure 2:
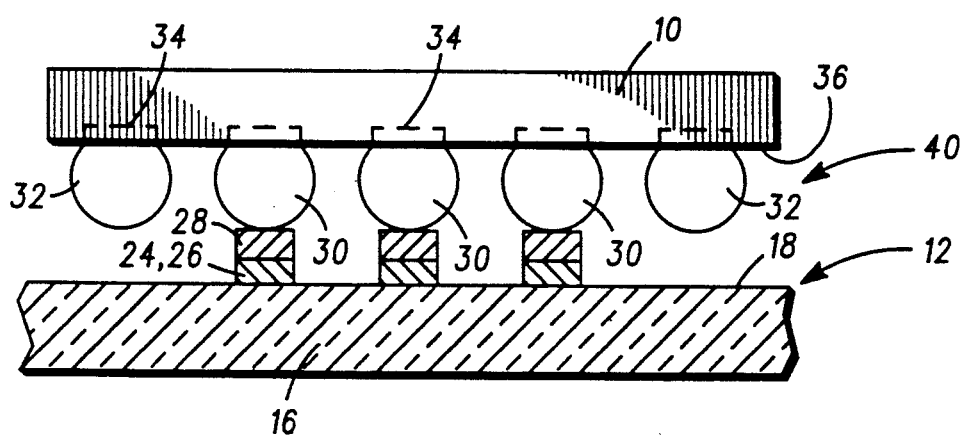
FIG. 2 is a cross-sectional view of the assembly in FIG. 1 taken along the line 2—2 in the direction of the arrow.
Figure 3:
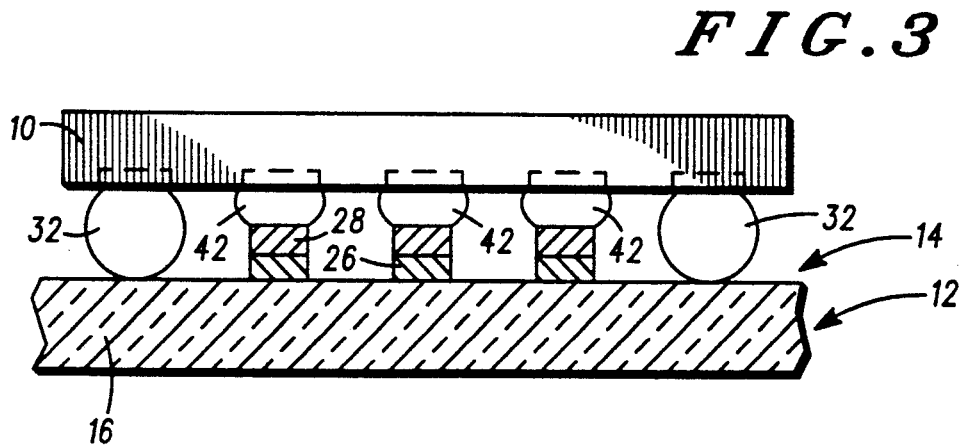
FIG. 3 is a cross-sectional view, similar to FIG. 2, but shown following solder reflow to form the interconnections.

Referring to FIGS. 1 and 2, in a preferred embodiment, the method of this invention is employed to attach a bumped integrated circuit die 10 to a plated printed circuit board 12 to form a microelectronic package 14, shown in FIG. 3.

Printed circuit board 12 comprises a dielectric substrate 16 that is a glass fiber-epoxy composite. Substrate 16 includes a planar surface region 18, shown in the figures, adapted for attachment of component 10. A circuit trace is affixed to substrate 16 and includes terminals 20 that extend onto region 18. Each terminal 20 includes a terminal pad 22 and a runner section 24 extending from the pad 22. In this embodiment, pads 22 are disposed in a perimeter array pattern for making interconnections about the perimeter of component 10. For purposes of clarity and illustration, only a few terminal pads are depicted, although a typical package includes as many as several hundred terminals to make the electrical connections necessary to carry out the intended electrical operations of the component. Also, for clarity, only a minor portion of the board 12 is shown in the figures that includes region 18 that is the site for attaching component 10. While only terminals 20 are depicted, the circuit trace extends onto surrounding regions of board 12 and includes additional features relevant to processing electrical signals. Runners 24 connect the associated pads 22 to the remainder of the circuit for conducting electrical signals to and from pads 22. In this example, pads 22 and runner sections 24 have a uniform width. However, the width may be varied between pad 22 and runner 24, for example, to optimize the pad size for bonding while minimizing the runner width.

Referring particularly to FIG. 2, each terminal 20 comprises two coextensive metal plates 26 and 28. Plate 26 lies immediately affixed to substrate 16 and is preferably formed of metallic copper having high electrical conductivity conducive to conducting electrical signals. Copper plate 26 is coated by a thin metal plate 28, which, in this embodiment, is composed of electroplated tin-lead solder alloy.

Printed circuit board 12 is preferably fabricated from a copper-plated FR4 card of the type that is readily commercially available. The card includes a uniform copper plate that covers surface 18 and provides a basis for forming the electrical circuit trace including terminals 20. The thickness of the copper plate is about 17 microns. To fabricate board 12, a film of a photoimageable polymer is applied to the copper plate and selectively irradiated and developed to form a photoresist mask having openings for exposing the copper plate in a pattern corresponding to the trace including terminals 20. The photoresist mask is about 25 microns thick and forms an electrically insulative coating on regions of the copper plate surrounding the desired trace.

The masked board is immersed in a tin-lead plating solution and cathodically biased to deposit solder alloy onto the exposed copper trace. A suitable plating bath comprises, in water, 56.3 grams per liter tin, added as concentrated stannous fluoroboric solution; 26.3 grams per liter lead, added as concentrated lead fluoroboric solution, 99.8 grams per liter fluoroboric acid; 26.3 grams per liter boric acid and 19.5 grams per liter liquid peptone. The masked board is immersed in the bath at ambient temperature spaced apart from a tin-lead counterelectrode. An electrical potential is applied to the copper plate to negatively bias the copper relative to the counterelectrode and codeposit metallic tin and metallic lead onto the exposed copper surface. One advantage of plating the tin-lead deposit onto the copper plate prior to defining the trace is that the continuous plate facilitates distribution of the plating current to produce a uniform electrodeposit. The resulting plate is composed of an alloy comprising about 40 weight percent lead and the balance tin, and having a melting point of about 183° C. The plate has a thickness of about 20 microns, less than the surrounding mask, so that plating is confined to the openings above the trace and does not extend upon the mask surface.

Following plating, the board is immersed in an alkaline solution to strip the photoresist mask, thereby exposing the copper plate about the solder-plated trace. The board is immersed in an aqueous copper-etching solution containing ammonium persulfate, followed by a water rinse. The etching solution dissolves the exposed copper. However, the tin-lead alloy is resistant to attack by the etching solution and acts as a mask to protect the underlying copper trace. In this manner, the unwanted copper is removed to define the terminals that are coated with a uniform, thin solder plate as depicted in FIG. 2.

In a separate operation, component 10 is fabricated to include a plurality of metal bumps 30 and 32, which, in this embodiment, are formed of an indium-lead solder alloy. Component 10 may be suitably an integrated circuit die, also referred to as a semiconductor chip, that includes a circuit having features for processing electrical signals conducted to and from the component through the interconnections. Alternately, the component may be a semiconductor chip mounted on a ceramic chip carrier, which carrier is adapted for forming the interconnections. Bumps 30 and 32 are affixed to solder wettable bond pads 34 formed on a generally planar surface 36 of component 10. To affix the solder bumps, component 20 is positioned with surface 36 facing up, and a preformed solder microball is placed onto each pad 34. The microball is formed of solder alloy comprising about 30 weight percent lead and the balance indium and having a melting temperature of about 172° C., corresponding to the melting temperature of the lead-indium peritectic composition. The microballs are heated to a temperature of about 195° C. to reflow the solder alloy onto the adjacent pads 34 to form the bumps. Upon cooling, bumps 30 and 32 are integrally bonded to the underlying pads.

In this embodiment, the solder bumps 30 and 32 are substantially uniform in size and composition, but are disposed on the component in arrangements corresponding to a first and second series. A series of first bumps 30 are disposed in a pattern superposable onto terminal pads 22. There is also a series of second bumps 32 located at the corners of component 10 apart from the terminals.

Following fabrication of the bumped component 10 and the solder-plated circuit board 12, the component and the board are arranged in an assembly 40 depicted in FIGS. 1 and 2. Prior to assembly, mildly activated rosin flux is applied to the bump tips that contact the plate. Component 10 is arranged with first bumps 30 resting against terminal pads 22. Second bumps 32 immediately overlies substrate surface 18 at sites spaced apart from terminal sections 20. Assembly 40 is then heated to a temperature of about 160° C. for about 45 seconds. During heating, a liquid phase forms at the interface between the solder plate and the solder bump. The nascient liquid wets the still-solid portions of the bump and plate. As heating continues, additional metal from the bump and the plate dissolve to increase the volume of liquid. Nevertheless, the total liquid is controlled, particularly in comparison to the substantially greater volume that would be formed by melting of the plate. During heating, there is no evidence of incipient melting of the plate on portions of the trace apart from the bond pad. The formation of the liquid may be accompanied by a settling of the component toward the board, causing bumps 32 to engage surface 18 to prevent further collapse and achieve a desired spacing between component 10 and board 12. Following heating, the assembly is cooled to solidify the liquid phase and produce interconnections 42, shown in FIG. 3, that bond the component to the terminal pad.

The resulting microelectronics package 14 comprises component 10 attached to printed circuit board 12 by solder bump interconnections 42. Each interconnection 42 extends between pad 34 of the component and pad 22 of the board to physically join and electrically connect the pads. Each interconnection 42 is formed of a continuous metal body that is integrally bonded to the plate on terminal 20. The method advantageously makes use of a uniform plate that can be applied to the trace in its entirety to protect the underlying copper from oxidation that would otherwise interfere with subsequent processing steps or might reduce performance of the package during use, and further does not require the application of a solder stop to contain the solder for the interconnection to the terminal bond pad. In addition, in this embodiment, the bumps are formed of a solder alloy having a relatively high reflow temperature. This high reflow solder is desired to produce a strong bond with the component, and is preferred over solders having lower reflow temperatures. Nevertheless, this method completes the interconnection at a suitably low temperature to avoid thermal degradation of the polymeric resin that forms the board. Thus, the method of this invention provides optimum bonding to both the component and the board trace.

While not limited to any particular theory, it is believed that, upon heating above the eutectic melting temperature in the described embodiment, a liquid initially forms at the interface, based upon tin from the plate and indium from the bump. This liquid phase wets the adjacent solid metals, which leads to further dissolution of the metals to increase the volume of liquid. The liquid formation is limited to the zone between the original solders. It is believed that a core of residual bump metal may survive the short heating cycle and remain bonded to the pad of the component. In any event, upon cooling, the liquid solidifies to produce an integral bond between the component and the terminal.

It is a significant feature of this invention that the method is carried out without exceeding the melting temperatures of the metal that initially forms the plate or the bumps. During heating, the metal plate remote from the interconnection remains solid. Also, the bumps do not melt, as evidenced by spacer bumps 32 that remain solid to support the component. In the described embodiment, the metal plate was formed of a tin-base alloy, whereas the metal bump was formed of an indium-base alloy. Alloys of about 49 percent tin and about 51 percent indium form a low-melting eutectic composition having a melting point of about 121° C. In the described embodiment, both alloys include lead. It is believed that the lead combines with the tin and indium in forming a low-melting liquid phase during heating, which, upon cooling, produces a joint having increased strength for withstanding stresses during operation, including stress attributed to differential thermal expansion of the component relative to the board. Tin and lead form a low-melting eutectic composition composed of about 37 weight percent lead and the balance tin and having a melting point of 183° C., which is significantly higher than the melting point of the indium-tin-base alloy that forms the interconnections in the described embodiments. In accordance with the described embodiment, a preferred alloy for the plate contains between about 35 and 45 weight percent lead, and the balance mainly tin. The bumps are preferably composed of between about 25 and 35 weight percent lead, and the balance indium. The alloy may also include additives, such as silver, to further enhance solder properties.

Although in the described embodiment, the plate and bumps are formed of solder alloys, this invention may employ a plate or bump that is not formed of a solder alloy, but rather are formed of metals that cooperate, or contain constituents that cooperate to form the desired solder alloy. In an alternate embodiment, a solder connection may be formed between a plate composed substantially of tin and a bump composed substantially of indium, wherein the metals combine to form an indium-tin solder alloy. As used herein, tin-base and indium-base metals refer to metals or alloys containing at least 50 weight percent tin and indium, respectively. Also, the compositions of the bump and plate may be switched, i.e., the bump may be formed of tin-base alloy and the plate formed of indium-base alloy. The method may be suitably carried out utilizing indium metal and tin metal, without lead, to form a lead-free interconnection.

While this invention has been described using a preferred combination of tin-base and indium-base alloys, it is not limited to forming interconnections based upon tin-indium solder, but rather may be carried out using other fusable combinations of metals that cooperate to form a low-melting solder composition. In another example of this invention, an interconnection is formed by a method similar to that described hereinabove, but utilizing a bump composed of indium-tin solder and the plate is composed of bismuth-tin solder. In this embodiment, a composition of the bump alloy is preferably selected to be similar to a eutectic composition containing about 49 weight percent indium and the balance tin and having a melting temperature at about 121° C. The composition of the plate solder is preferably similar to a low-melting eutectic composition containing about 40 weight percent tin and the balance bismuth and melting at about 139° C. Bismuth and indium form a low-melting eutectic composition at about 85° C., which comprises about 50 weight percent indium and 50 weight percent bismuth. The bump and plated board are assembled and heated above about 85° C., but less than the bismuth-tin alloy melting temperature and the indium-tin alloy melting temperature. During heating, a liquid phase forms at the bump-plate interface, which, upon cooling and solidifying, completes the interconnection.

In the described embodiment, the component includes a series of first bumps that form the interconnections and further a series of second bumps that are disposed to avoid the terminals and serve as spacers to obtain a uniform spacing following interconnection. While in the described embodiment, the spacer bumps collapsed against the dielectric substrate, in an alternate embodiment, the space bumps may collapse against copper pads similar to the trace, but without the solder plating, to increase the height. Since the spacer bumps do not reflow during heating and cooling to form the interconnection, the spacer bumps do not become bonded to the bare copper.

While this invention has been described in terms of certain embodiments thereof, it is not intended that it be limited to the above description, but rather only to the extent set forth in the claims that follow.

The embodiments of the invention in which an exclusive property or privilege is claimed are defined as follows:

1. A method for forming a microelectronic component package comprising an integrated circuit component attached to a printed circuit board by a solder bump interconnection, said method comprising fabricating a printed circuit board comprising a metal trace including at least one terminal comprising a bond pad and a runner section connected to the pad, said terminal comprising a metal plate coating the pad and runner section and being composed of a first metal having a first melting temperature, attaching at least one metal bump to the component, said bump being composed of a second metal compositionally distinct from the first metal and having a second melting temperature, said first metal comprising a first metal constituent and said second metal comprising a distinct second metal constituent such that the first and second metal constituents are capable of combining to form a solder composition having a third melting temperature less than the first melting temperature and the second melting temperature, superposing said component onto the board to form an assembly such that the metal bump contacts the metal plate coating said bond pad, heating the assembly to a temperature greater than the third melting temperature but less than the first melting temperature and the second melting temperature, whereupon at the bond pad the first metal and the second metal cooperate to form an interfacial liquid phase that wets the metal plate and the metal bump, and cooling the assembly to solidify the liquid phase to form solder bump interconnections that bond the component to the board.

2. The method in accordance with claim 1 wherein the plate is composed of a first metal selected from the group consisting of tin-base metal and indium-base metal and the bumps are composed of a second metal selected from the group.

3. The method in accordance with claim 1 wherein the first metal is a tin-base alloy and the second metal is an indium-base alloy.

4. The method in accordance with claim 1 wherein the solder plate is deposited onto the trace by electroplating.

5. The method in accordance with claim 1 wherein the plate is composed of a first metal selected from the group consisting of indium-containing metal and bismuth-containing metal and the plate is composed of a second alloy selected from the group.

6. The method in accordance with claim 1 wherein the first metal is a bismuth-containing tin alloy and the second alloy is an indium-containing tin alloy.

7. A method for forming a microelectronic component package comprising an integrated circuit component attached to a printed circuit board by a plurality of solder bump interconnections, said method comprising fabricating a printed circuit board comprising a solder-wettable metal trace affixed to a dielectric substrate, said trace comprising a plurality of terminals, each terminal comprising a bond pad and a runner section connected to the pad and comprising a solder plate overlying the bond pad and the runner section, said solder plate being formed of a tin-base metal having a first melting temperature, attaching a plurality of solder bumps to the component, said solder bumps being composed of an indium-base metal having a second melting temperature, superposing said component onto the board to form an assembly such that the solder plate at each said bond pad contacts the corresponding bump, heating the assembly to a temperature greater than the tin-indium eutectic melting temperature but less than the first melting temperature and the second melting temperature, whereupon at each bond pad the tin-base metal and the indium-base metal cooperate to form an interfacial liquid phase that wets the solder plate and the solder bump, and cooling the assembly to solidify the liquid phase to form solder bump interconnections that bond the component to the board.

8. The method in accordance with claim 7 wherein the tin-base metal and the indium-base metal are solder alloys containing lead.

9. The method in accordance with claim 7 wherein the tin-base metal is composed of between about 35 and 45 weight percent lead and the balance tin.

10. The method in accordance with claim 7 wherein the indium-base metal is composed of between about 25 and 35 weight percent lead and the balance indium.

11. A method for forming a microelectronic component package comprising an integrated circuit component attached to a printed circuit board by a plurality of solder bump interconnections, said method comprising fabricating a printed circuit board comprising a solder-wettable metal trace affixed to a dielectric substrate, said trace comprising a plurality of terminals, each terminal comprising a bond pad and a runner section connected to the pad and further including a solder plate overlying the the bond pad and the runner section, said solder plate being formed of an indium-containing alloy having a first melting temperature, attaching a plurality of solder bumps to the component, said bumps being composed of a bismuth-containing alloy having a second melting temperature, superposing said component onto the board to form an assembly such that a solder bump contacts the solder plate at each said bond pad, heating the assembly to a temperature greater than the indium-bismuth eutectic melting temperature but less than the first melting temperature and the second melting temperature, whereupon at each bond pad the indium-containing alloy and the bismuth-containing alloy cooperate to form an interfacial liquid phase that wets the solder plate and the solder bump, and cooling the assembly to solidify the liquid phase to form solder bump interconnections that bond the component to the board.

12. The method in accordance with claim 11 wherein the indium-containing alloy and the bismuth-containing alloy contain tin.

13. The method in accordance with claim 11 wherein the solder plate is composed of indium-tin alloy.

14. The method in accordance with claim 11 wherein the solder bumps are composed of bismuth-tin alloy.

* * * * *